United States Patent
Toshikawa et al.

(10) Patent No.: US 7,122,486 B2
(45) Date of Patent: Oct. 17, 2006

(54) FILM FORMING METHOD

(75) Inventors: Kiyohiko Toshikawa, Miyazaki (JP); Junichi Miyano, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 228 days.

(21) Appl. No.: 10/844,543

(22) Filed: May 13, 2004

(65) Prior Publication Data

US 2005/0118834 A1 Jun. 2, 2005

(30) Foreign Application Priority Data

Nov. 27, 2003 (JP) ............................. 2003-397110

(51) Int. Cl.
*H01L 21/31* (2006.01)
*H01L 21/469* (2006.01)

(52) U.S. Cl. ...................................... 438/778; 438/792

(58) Field of Classification Search ................ 438/778, 438/784, 789, 790, 792
See application file for complete search history.

(56) References Cited

U.S. PATENT DOCUMENTS 6,334,801 B1 * 1/2002 Kawade et al. ............... 445/24
6,586,056 B1 * 7/2003 Arkles et al. ............... 427/582
6,953,600 B1 * 10/2005 Yokoyama et al. ......... 427/123

FOREIGN PATENT DOCUMENTS

JP 06-283520 10/1994
JP 11-214670 8/1999
JP 2001-015698 1/2001

* cited by examiner

*Primary Examiner*—Phuc T. Dang
(74) *Attorney, Agent, or Firm*—Volentine Francos & Whitt, PLLC

(57) ABSTRACT

CVD is performed without damaging a micro-fabricated semiconductor element. An organic material gas containing amine is used as deposition material gas. The material gas is introduced into a vacuum chamber and ultraviolet light radiated from each of lamps is applied onto an object to be processed that is placed in the chamber, thereby causing chemical vapor deposition to be carried out, whereby a film is grown at a temperature such that no damage is given to a semiconductor element or the like of the object.

11 Claims, 1 Drawing Sheet

FILM FORMING METHOD

BACKGROUND OF THE INVENTION

1. Field of the Invention

The present invention relates to a method of forming a film such as an insulating film, a protective film or the like employed in a semiconductor element or the like, and particularly to a method capable of forming a film without giving damage to a semiconductor element or the like in a forming process.

2. Description of the Related Art

In the manufacture of a semiconductor integrated circuit, for example, an insulating film is made up of $SiO_2$ or the like, and a protective film is made up of a nitride film such as $Si_3N_4$. These films are generally formed by a Chemical Vapor Deposition (CVD) method but has heretofore been formed by a plasma CVD method (see Patent Documents 1 and 2) or thermal CVD methods such as an LP (Low Pressure) CVD method or the like.

For example, the nitride film made up of $Si_3N_4$ is grown by an LPCVD method done at a high reaction temperature ranging from 800° C. to 900° C. using dichlorosilane and ammonia gases as material gases.

There was also known an ECR-CVD method (Electron Cycrotron Resonance-Chemical Vapor Deposition method) (see Patent Document 3).

However, a drawback arose in that when the protective film or the insulating film was deposited by the thermal CVD method, plasma CVD method or ECR-CVD method referred to above, damage was given to the semiconductor integrated circuit.

Described specifically, the spread of a diffused layer has occurred due to a high reaction temperature in the case of the thermal CVD method. Further, a semiconductor element has suffered damage due to charged particles in plasma in the case of the plasma CVD method. Furthermore, about 400° C. is considered to be needed as the temperature of an electrochemical reaction even in the case of the ECR-CVD method although it is less than expected by the thermal CVD method. Thus, the spread of a diffused layer occurred.

On the other hand, when the semiconductor integrated circuit is micro-fabricated, each of MOSFETs (Metal Oxide Semiconductor Field Effect Transistors) formed in such a semiconductor integrated circuit, for example, becomes constructionally short in gate length, and the depth of a diffused layer such as a channel becomes shallow and its width becomes also narrow. Thus, a defective condition such as the spread of the diffused layer due to the above-described heat is now becoming a problem to be solved, which is important to the micro-fabricated semiconductor integrated circuit.

Patent Documents 1, 2 and 3

Japanese Unexamined Patent Publication No. Hei 6(1994)-283520: refer particularly to paragraph 0077.

Japanese Unexamined Patent Publication No. Hei 11(1999)-214670

Japanese Unexamined Patent Publication No. 2001-15698

SUMMARY OF THE INVENTION

With the foregoing problems in view, it is therefore an object of the present invention to form a film by CVD without giving damage to a micro-fabricated semiconductor element.

According to one aspect of the present invention, there is provided a method of forming a film, comprising the following steps of:

introducing an organic gas containing amine into a chamber; and performing chemical vapor deposition while irradiating the organic gas with an electromagnetic wave having a wavelength, which has energy exceeding binding energy existent in molecules in the organic gas.

The film forming method according to the present invention has the advantage of enabling the formation of a CVD film so as not to give damage to a heat-sensitive portion of a micro-fabricated semiconductor element or the like.

The purpose of performing a CVD-based chemical reaction by using a powerful electromagnetic wave without using heat or plasma is realized by equipping a vacuum ultraviolet light CVD apparatus with Xe2 excimer lamps.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawing in which:

DETAILED DESCRIPTION OF THE INVENTION

Figure 1:
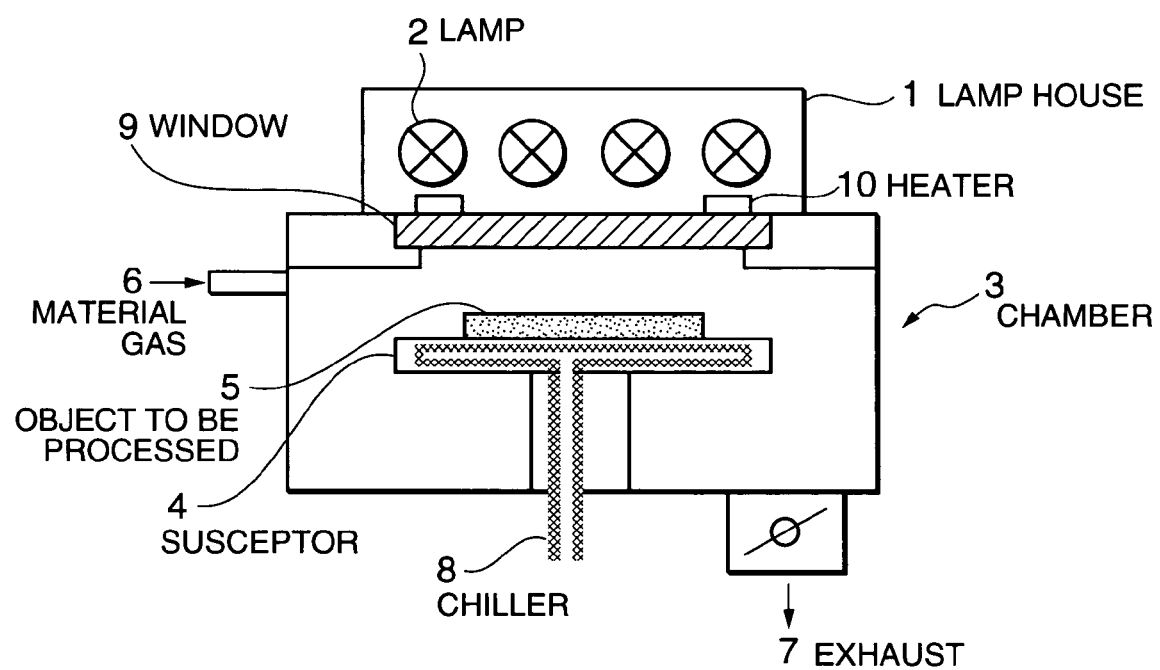
FIG. 1 is an explanatory view showing an apparatus for carrying out a film forming method according to the present invention (FIG. 1 is used to describe first through fifth embodiments).

Preferred embodiments of the present invention will be described hereinbelow with reference to the accompanying drawing.

First Embodiment

FIG. 1 is a cross-sectional view of an apparatus used to implement a film forming method according to the present invention. This apparatus is equipped with a device for generating ultraviolet radiation or light corresponding to a kind of electromagnetic wave. In the present apparatus, reference numeral 1 indicates a lamp house, and reference numerals 2 indicate lamps provided within the lamp house 1. These are provided to realize the present invention.

As the lamps 2, Xe2 excimer lamps are adopted. Each of the lamps 2 generates ultraviolet radiation or light having a wavelength of 172 nm and a photon energy of 7.2 eV. The ultraviolet radiation is radiated into a vacuum ultraviolet light CVD device or apparatus to be descried later via its window.

The vacuum ultraviolet light CVD device has a susceptor 4 disposed within a chamber 3. A CVD film is formed on an object 5 to be processed placed on the susceptor 4. Therefore, a material gas 6 is introduced into the chamber 3. After its processing, the unnecessary gas is discharged as an exhaust 7.

In order to suitably perform CVD, the susceptor 4 is held at a predetermined temperature, e.g., a room temperature of 25° C. by a chiller 8 corresponding to a cooling system in such a manner that its temperature is not excessively raised.

A window 9 is provided above the vacuum ultraviolet light CVD device. The window 9 is made up of, for example, quart and has a thickness of 20 mm, for example. The intensity of illumination of the lamp 2 is 40 mW/cm² directly beneath the window 9. The illumination intensity thereof is equivalent to an illumination intensity measured where an illuminometer is directly attached to the window 9 within the chamber 3.

The distance from the window 9 to the object 5 within the chamber 3 is 25 mm, for example. Since the chamber 3 is held with vacuum thereinside, there is no one that interferes with the passage of ultraviolet radiation over the distance.

Assuming now that the temperature of the window 9 is substantially identical to the room temperature, a film is deposited or grown even on a lower surface of the window 9 so that the fogging occurs, thereby reducing the illumination intensity of radiation with respect to the object 5. Therefore, the window 9 is provided with a heater 10. Thus, the temperature of the window 9 is maintained at a constant temperature of 90 C., for example. The heater 10 is shaped in the form of a disc or a ring.

The first embodiment will explain a case in which laminating at BTBAS low pressure (2.66 Pa (20 mTorr)) alone is done using the above-described apparatus.

First, a PCT evaluating sample to be described later is placed in the chamber 3.

(1) First Process Step:

BTBAS is introduced into the chamber 3 at a vapor pressure of 20 mTorr. The Xe2 excimer lamps 2 are illuminated for 10 minutes at a reaction pressure of 2.66 Pa (20 mTorr) to deposit or grow a vacuum ultraviolet light CVD film with a thickness of 100 nm (1000 Å).

Here, the film at the BTBAS low pressure (2.66 Pa (20 mTorr)) is equivalent to a film deposited under conditions of low pressure (2.66 Pa (20 mTorr)), using bis (tertial-butylamino) silane (BTBAS: $SiH_2[NH(C_4H_9)]_2$) corresponding to an organic material having straight chain amine (N—H).

This is a film in which the number of material gas molecules is smaller than the number of photons of the vacuum ultraviolet light, and provides sufficient decomposition of a material gas. Thus, the material gas molecules are decomposed with efficiency. Therefore, the present film results in a film in which organic substances are less reduced. As a result, the film is hard to be oxidized even if the object 5 formed with the present film is left in the air.

The principle of the vacuum ultraviolet light CVD will now be described.

As theoretical values of a plurality of binding energies contained in the organic material having amine (N—H), may be mentioned 5.0 eV, 4.3 eV, 3.6 eV, 3.0 eV and 4.0 eV in the case of Si—N binding, C—H binding, C—C binding, Si—H binding and N—H binding respectively. In contrast, the vacuum ultraviolet light of each xenon (Xe) excimer lamp employed in the present invention has very high energy in which its wavelength is 172 nm, i.e., its photon energy is 7.2 eV. Therefore, the organic material gas can be easily decomposed. Thus, it is possible to carry out CVD at the room temperature and easily deposit or grow the film.

(2) Second Process Step:

After the deposition of the film, the gas is stopped and sample curing is done by the vacuum ultraviolet light for 10 minutes as is. The sample is transferred to another chamber so as not to be subjected to the atmosphere, where its curing may be carried out. The time for its curing may be varied according to the thickness of the deposited film.

(3) The above first and second process steps are repeatedly performed according to a desired integrated film thickness.

The inventors of the present invention have performed a PCT (Pressure cooker test) on samples on which the first and second process steps are effected five times. The conditions of the PCT are a temperature of 130° C., a moisture content of 85%, 2.5 pressures and 100 hours. As the sample to be subjected to the PCT, was used one wherein a BPSG film was deposited 500 nm (5000 Å) on an Al wiring pattern. By carrying out the PCT, boron and phosphor contained in the BPSG film on the Al wiring pattern react with moisture where the film is not impervious to the moisture. Consequently, boric acid and phosphoric acid are generated to erode an Al wiring. The evaluation of film quality was conducted according to the level or degree of its erosion.

Then, the erosion conditions of the underlying Al wiring were examined. As a result, Al erosion occurred in a sample with no deposition of the vacuum ultraviolet light CVD film, whereas Al erosion was not observed in a sample in which a film obtained by laminating the vacuum ultraviolet light CVD film on a protective film was grown, in a manner similar to the sample in which the plasma oxide film or plasma nitride film was deposited.

Thus, it was concluded that the vacuum ultraviolet light CVD laminated film produced using BTBAS as the raw material had moisture-proof performance equivalent to the plasma oxide film or the plasma nitride film.

According to the first embodiment, a film deposited at low pressure and hard to be oxidized even if left in the air is put to practical use as a monolayer barrier film. In this case, the film is not deposited at a time. Its curing is done by vacuum ultraviolet light each time the film is grown a predetermined amount. Binding forces between atoms and molecules can be strengthened over the entire film in this manner. Consequently, a barrier property is further improved. Further, when the underlying bed is Al, it is effective to perform curing by the vacuum ultraviolet light before the film deposition in order to improve the adhesion between the underlying bed and the vacuum ultraviolet light CVD film.

(Modification of First Embodiment)

A description will next be made of a case in which the kind of the material gas is changed and laminating at HMCTSM low pressure (2.66 Pa (20 mTorr)) alone is done.

A PCT evaluating sample is inserted into the chamber 3.

(1) First Process Step:

HMCTSN is introduced under a vapor pressure of 2.66 Pa (20 mTorr). The Xe2 excimer lamps are illuminated for 5 minutes under a reaction pressure of 2.66 Pa (20 mTorr). Consequently, a vacuum ultraviolet light CVD film is deposited 100 nm (1000 Å).

Here, the film at the HMCTSN (2.66 Pa (20 mTorr) is equivalent to a film deposited under conditions of low pressure (2.66 Pa (20 mTorr)), using hexamethyl-cyclotrisiloxane (HMCTSN: $Si_3C_3H_{21}N_3$) corresponding to an organic material having cyclic amine (N—H).

This is a film in which the number of material gas molecules is smaller than the number of photons of vacuum ultraviolet light, and provides sufficient decomposition of a material gas in a manner similar to the film using BTBAS under the condition of the low pressure (2.66 Pa (20 mTorr)). Thus, the material gas molecules are decomposed with efficiency. Therefore, the present film results in a film in which organic substances are less reduced. As a result, the film is hard to be oxidized even if the object 5 formed with the present film is left in the air.

(2) Second Process Step:

After the deposition of the film, the gas is stopped and curing is done by the vacuum ultraviolet light for 10 minutes as is. The sample is transferred to another chamber so as not to be subjected to the atmosphere, where the curing may be carried out. The time for curing may be varied according to the thickness of the deposited film.

(3) The above first and second process steps are repeatedly performed according to a desired integrated film thickness.

The inventors of the present invention have performed the above-described PCT on samples on which the first and second process steps are conducted five times. Then, the erosion conditions of the underlying Al wiring were examined. As a result, Al erosion occurred in a sample with no deposition of the vacuum ultraviolet light CVD film, whereas Al erosion was not observed in a sample in which a film obtained by laminating the vacuum ultraviolet light CVD film on a protective film was grown, in a manner similar to the sample in which the plasma oxide film or plasma nitride film was deposited.

Thus, it was concluded that the vacuum ultraviolet light CVD laminated film produced using HMCTSN as the raw material had moisture-proof performance equivalent to the plasma oxide film or the plasma nitride film.

Second Embodiment

A second embodiment will explain a case in which a laminated film at BTBAS low pressure (2.66 Pa (20 mTorr)) and HMCTSN low pressure (2.66 Pa (20 mTorr)) is formed using the same apparatus identical to the first embodiment.

A PCT evaluating sample is first introduced into its corresponding chamber 3. Thereafter, the following process steps are performed.

(1) First Process Step:

HMCTSN is introduced under a vapor pressure of 2.66 Pa (20 mTorr). Then, Xe2 excimer lamps are illuminated for 5 minutes under a reaction pressure of 2.66 Pa (20 mTorr). Consequently, a vacuum ultraviolet light CVD film is deposited 100 nm (1000 Å). The time for its irradiation is varied according to the film thickness.

(2) Second Process Step:

After the deposition of the film, the gas is stopped and curing is done by the vacuum ultraviolet light for 10 minutes as is. The sample is transferred to another chamber so as not to be subjected to the atmosphere, where the curing may be carried out. The time for curing may be varied according to the thickness of the deposited film.

Thus, after the film deposition, binding forces between atoms and molecules in the film are strengthened by performing the curing with the vacuum ultraviolet light.

(3) Third Process Step:

BTBAS ($SiH_2[NH(C_4H_9)]_2$) is introduced into the chamber 3 under a vapor pressure of 2.66 Pa (20 mTorr). Then, the Xe2 excimer lamps are illuminated for 10 minutes under a reaction pressure of 2.66 Pa (20 mTorr), so that a vacuum ultraviolet light CVD film is deposited 100 nm (1000 Å). The time for its irradiation is varied according to the film thickness.

Thus, CVD is performed at the room temperature according to the principle similar to the first process step to enable easy film deposition.

(4) Fourth Process Step:

After the deposition of the film, the gas is stopped and curing is done by the vacuum ultraviolet light for 10 minutes as is. The sample is transferred to another chamber so as not to be subjected to the atmosphere, where the curing may be carried out. The time for curing may be varied according to the thickness of the deposited film.

Thus, after the film deposition, binding forces between atoms and molecules in the film are strengthened in a manner similar to the second process step by performing the curing with the vacuum ultraviolet light.

(5) The above first through fourth process steps are repeatedly performed according to a desired integrated film thickness.

The inventors of the present invention have performed the above-described PCT on samples on which the first through fourth process steps are conducted twice.

Then, the erosion conditions of the underlying Al wiring were examined. As a result, Al erosion occurred in a sample with no deposition of the vacuum ultraviolet light CVD film, whereas Al erosion was not observed in a sample in which a film obtained by laminating the vacuum ultraviolet light CVD film on a protective film was grown, in a manner similar to the sample in which the plasma oxide film or plasma nitride film was deposited.

Thus, it was concluded that the vacuum ultraviolet light CVD laminated film produced using HMCTSN and BTBAS as the raw materials had moisture-proof performance equivalent to the plasma oxide film or the plasma nitride film.

Incidentally, although the above-described embodiment has explained the example in which HMCTSN is first used, the present invention is not limited to it. BTBAS may first be used. That is, both HMCTSN and BTBAS are allowed to be used in the top or uppermost film.

According to the second embodiment, a film deposited at low pressure and hard to be oxidized even if left in the air can be put to practical use as a barrier film. In this case, the two types of films are laminated by being utilized in combination as described above. Thus, a barrier property can be improved. After the film deposition, curing is done by the vacuum ultraviolet light, so that binding forces between atoms and molecules in the resultant film are strengthened. Thus, the barrier property is further improved. Further, when the underlying bed is Al, it is effective to perform curing by the vacuum ultraviolet light before the film deposition in order to improve the adhesion between the underlying bed and its corresponding vacuum ultraviolet light CVD film. Such a barrier film as described above can be formed without damaging a semiconductor element.

Third Embodiment

In a third embodiment, a process for forming a laminated film under BTBAS high pressure (13.3 Pa (100 mTorr)) and HMCTSN low pressure (2.66 Pa (20 mTorr)) is executed using the same apparatus as the first embodiment.

A PCT evaluating sample is first introduced into a chamber 3.

(1) First Process Step:

HMCTSN is introduced under a vapor pressure of 2.66 Pa (20 mTorr). Then, Xe2 excimer lamps are illuminated for 5 minutes under a reaction pressure of 2.66 Pa (20 mTorr). Consequently, a vacuum ultraviolet light CVD film is deposited 100 nm (1000 Å).

The film at the HMCTSN low pressure (2.66 Pa (20 mTorr)) is equivalent to such a film as described in the first embodiment referred to above.

(2) Second Process Step:

After the deposition of the film, the gas is stopped and curing is done by vacuum ultraviolet light for 10 minutes as is. The sample is transferred to another chamber so as not to be subjected to the atmosphere, where the curing may be carried out. The time for curing may be varied according to the thickness of the deposited film.

(3) Third Process Step:

BTBAS ($SiH_2[NH(C_4H_9)]_2$) is introduced into the chamber 3 under a vapor pressure of 9.31 Pa (70 mTorr). Though an organic material having amine (N—H), such as BTBAS, HMCTSN or the like is liquid at room temperature, evaporation occurs from its liquid level at the vapor pressure of 9.31 Pa (70 mTorr). Thus, the vapor pressure is obtained in a vapor pressure range less than or equal to 9.31 Pa (70 mTorr). The low pressure (2.66 Pa (20 mTorr)) is equivalent to one obtained by suitably weakening and adjusting the vapor pressure. On the other hand, the high pressure (13.3 Pa (100 mTorr)) is obtained by sealing evaporated vapors. That is, the high pressure (13.3 Pa (100 mTorr)) is obtained by closing a butterfly valve (not shown) provided in the entrance for the material gas 6, of the chamber 3 in FIG. 1. Then, the Xe2 excimer lamps are illuminated for 1 minute under a reaction pressure of 13.3 Pa (100 mTorr) so that a vacuum ultraviolet light CVD film is deposited or grown 100 nm (1000 Å).

Here, the film at the BTBAS high pressure (13.3 Pa (100 mTorr)) is equivalent to a film deposited under conditions of high pressure (13.3 Pa (100 mTorr)), using bis (tertialbutylamino) silane (BTBAS: ($SiH_2[NH(C_4H_9)]_2$)) corresponding to an organic material having straight chain amine (N—H).

This is a film in which the number of material gas molecules is larger than the number of photons of the vacuum ultraviolet light. This film is insufficient for the decomposition of a material gas. Thus, only some of the material gas molecules are decomposed. Therefore, the film results in a film that contains methyl groups in large numbers. As a result, the methyl groups are naturally desorbed when an object 5 to be processed formed with the film is left in the air. Consequently, the film is oxidized.

Next, a vacuum ultraviolet light CVD film is grown as a protective film. That is, since the film formed under the high pressure is easy to be subjected to oxidation, a film is formed under low pressure by using the same material, as a protective film for preventing its oxidation. The time required to produce the protective film is 20 minutes, and BTBAS for the material gas is supplied at a vapor pressure of 2.66 Pa (20 mTorr). Further, the reaction pressure is 2.66 Pa (20 mTorr) and the temperature on a susceptor is room temperature. That is, an unillustrated butterfly valve is opened to adjust the pressure in the chamber 3 to 2.66 Pa (20 mTorr), and thereafter the vacuum ultraviolet light is irradiated for 20 minutes.

(4) Fourth Process Step:

After the deposition of the film, the gas is stopped and curing is done by vacuum ultraviolet light for 10 minutes as is. The sample is transferred to another chamber so as not to be subjected to the air, where the curing may be carried out. The time for curing may be varied according to the thickness of the deposited film.

(5) The above first through fourth process steps are repeatedly performed according to a desired integrated film thickness.

The inventors of the present invention have performed the above-described PCT on samples on which the first through fourth process steps are conducted twice. Then, the erosion conditions of an underlying Al wiring were examined. As a result, Al erosion occurred in a sample with no deposition of the vacuum ultraviolet light CVD film, whereas Al erosion was not observed in a sample in which a film obtained by laminating the vacuum ultraviolet light CVD film on a protective film was grown, in a manner similar to the sample in which the plasma oxide film or plasma nitride film was deposited.

Thus, it was concluded that the vacuum ultraviolet light CVD laminated film produced using HMCTSN and BTBAS as the raw materials had moisture-proof performance equivalent to the plasma oxide film or the plasma nitride film.

Incidentally, although the above-described embodiment has explained the example in which HMCTSN is first used; the present invention is not limited to it. BTBAS may first be used. That is, both HMCTSN and BTBAS are allowed to be used in the top or uppermost film.

According to the third embodiment, a film deposited under low pressure and resistant to oxidation even if left in the atmosphere, and a film (film with many dangling bonds) susceptible to oxidation, which is deposited under high pressure, are laminated in combination, whereby the laminated film can be utilized as a barrier film. In this case, the easy-to-be-oxidized film deposited under high pressure functions as an oxygen or moisture adsorbent. It is therefore possible to improve a barrier property. After the film deposition, curing is done by the vacuum ultraviolet light, so that binding forces between atoms and molecules in the resultant film are strengthened. Thus, the barrier property is further improved. Further, when an underlying bed is Al, it is effective to perform curing by the vacuum ultraviolet light before the deposition in order to improve the adhesion between the underlying bed and its corresponding vacuum ultraviolet light CVD film.

Fourth Embodiment

A fourth embodiment will explain a case in which laminating at BTBAS high pressure (39.9 Pa(300 mTorr)) alone is done using the same apparatus as the first embodiment.

Here, the film at the BTBAS high pressure (39.9 Pa (300 mTorr) is equivalent to a film deposited under conditions of high pressure (39.9 Pa(300 mTorr)), using bis (tertial-butylamino) silane (BTBAS: ($SiH_2[NH(C_4H_9)]_2$)) corresponding to an organic material having straight chain amine (N—H).

When the pressure is high in this way, the decomposition of a material gas by the vacuum ultraviolet light is reduced and only some of the material gas are decomposed. Therefore, relatively large reaction-activated species can be produced. Thus, a thin film indicative of a flow characteristic can be formed. The film having such film quality is effective in forming an underlying bed that needs embedding of a step. Also this film results in a film containing many methyl groups ($CH_3$), and the methyl groups are naturally uncoupled or desorbed even if the film is left in the atmosphere. Thus, the film becomes a film susceptible to oxidation.

In order to form such a film, a PCT evaluating film is first inserted into a chamber 3.

(1) First Process Step:

BTBAS is introduced into the chamber 3 at a vapor pressure of 9.98 Pa (75 mTorr). Xe2 excimer lamps 2 illuminated for 1 minute at a reaction pressure of 39.9 Pa (300 mTorr) to deposit a vacuum ultraviolet light CVD film 5 with a thickness of 300 nm (3000 Å).

(2) Second Process Step:

After the deposition of the film, the gas is stopped and sample curing is done by the vacuum ultraviolet light for 10 minutes as is. The sample is transferred to another chamber so as not to be subjected to the atmosphere, where the curing may be carried out. The time for curing may be varied according to the thickness of the deposited film.

(3) The above first and second process steps are repeatedly performed according to a desired integrated film thickness.

The inventors of the present invention have performed the above-described PCT on samples on which the first through fourth process steps are conducted five times. Then, the erosion conditions of an underlying Al wiring were examined. As a result, Al erosion occurred in a sample with no deposition of the vacuum ultraviolet light CVD film, whereas Al erosion was not observed in a sample in which a film obtained by laminating the vacuum ultraviolet light CVD film on a protective film was grown, in a manner similar to the sample in which the plasma oxide film or plasma nitride film was deposited.

Thus, it was concluded that the vacuum ultraviolet light CVD laminated film produced using BTBAS as the raw material had moisture-proof performance equivalent to the plasma oxide film or the plasma nitride film.

According to the fourth embodiment, a film (film with many dangling bonds) susceptible to oxidation, which is deposited under high pressure, can be used as a step embeddable underlying material. After the film deposition, curing is done by the vacuum ultraviolet light, whereby binding forces between atoms and molecules in the resultant film are strengthened. Thus, the strength of an underlying bed is improved. Further, when the underlying wiring is Al, it is effective to perform curing by the vacuum ultraviolet light before the film deposition in order to improve the adhesion between the underlying wiring and its corresponding vacuum ultraviolet light CVD film.

Fifth Embodiment

A fifth embodiment will explain a case in which curing is done by vacuum ultraviolet light before film deposition as in the first through fourth embodiments.

A PCT evaluating sample is first inserted into a chamber 3.

(1) First Process Step:

The curing is performed by the vacuum ultraviolet light for 5 minutes. The curing may be carried out in a chamber different from the chamber that performs film deposition. The time for curing may be changed according to the conditions of adhesion of organic substances to each underlying sample.

(2) Second Process Step:

The same process step as each process step employed in any of the first through fifth embodiments is done.

The inventors of the present invention have performed the above-described PCT on each of five samples produced in the fifth embodiment. Then, the erosion conditions of an underlying Al wiring were examined. As a result, Al erosion occurred in a sample with no deposition of a vacuum ultraviolet light CVD film, whereas Al erosion was not observed in a sample in which a film obtained by laminating the vacuum ultraviolet light CVD film on a protective film was grown, in a manner similar to the sample in which the plasma oxide film or plasma nitride film was deposited.

Thus, it was concluded that the vacuum ultraviolet light CVD laminated film on which pre-deposition curing was effected, had moisture-proof performance equivalent to the plasma oxide film or the plasma nitride film.

Incidentally, although each of the above embodiments has explained the case in which the ultraviolet light is used in CVD, the present invention is not limited to the ultraviolet light but is capable of using a more powerful electromagnetic wave if the principle of the present invention intends to use an electromagnetic wave exceeding coupling or binding energy in a raw material.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of forming a film, comprising:
   introducing an organic gas containing amine into a chamber; and
   performing chemical vapor deposition while irradiating the organic gas with an electromagnetic wave having a wavelength which has energy exceeding binding energy existent in molecules in the organic gas,
   wherein the chamber is selected with a window defined therein,
   the electromagnetic wave is irradiated via the window provided in the chamber, and
   the window is held at a predetermined temperature.

2. A method of forming a film, comprising:
   introducing an organic gas containing amine into a chamber; and
   performing chemical vapor deposition while irradiating the organic gas with an electromagnetic wave having a wavelength which has energy exceeding binding energy existent in molecules in the organic gas,
   wherein bis tertial-butylamino silane is selected as the organic gas.

3. A method of forming a film, comprising:
   introducing an organic gas containing amine into a chamber; and
   performing chemical vapor deposition while irradiating the organic gas with an electromagnetic wave having a wavelength which has energy exceeding binding energy existent in molecules in the organic gas,
   wherein hexamethyl-cyclotrisiloxane is selected as the organic gas.

4. A method of forming a film, comprising:
   introducing an organic gas containing amine into a chamber;
   performing chemical vapor deposition while irradiating the organic gas with an electromagnetic wave having a wavelength which has energy exceeding binding energy existent in molecules in the organic gas; and
   irradiating the semiconductor substrate with ultraviolet light prior to introducing the organic gas.

5. A method of forming a film, comprising:
introducing a first organic gas into a chamber;
performing chemical vapor deposition while irradiating the first organic gas with an electromagnetic wave having a wavelength, which has energy exceeding binding energy existent in molecules in the first organic gas;
exhausting the first organic gas;
introducing a second organic gas into the chamber;
performing chemical vapor deposition while irradiating the second organic gas with an electromagnetic wave having a wavelength, which has energy exceeding binding energy existent in molecules in the second organic gas; and
exhausting the second organic gas,
wherein the first organic gas and the second organic gas contain amine respectively.

6. A method according to claim 5, further comprising irradiating the film formed by the chemical vapor deposition with ultraviolet light.

7. A method according to claim 5, wherein the chamber is selected with a window defined therein,
the electromagnetic waves are irradiated via the window provided in the chamber, and
the window is held at a predetermined temperature.

8. A method according to claim 5, wherein bis tertial-butylamino silane is selected as the first organic gas, and hexamethyl-cyclotrisiloxane is selected as the second organic gas.

9. A method according to claim 5, wherein the chemical vapor deposition is effected on a semiconductor substrate formed with an integrated circuit.

10. A method according to claim 9, wherein the integrated circuit has wirings or elements made up of aluminum.

11. A method according to claim 5, further comprising irradiating the semiconductor substrate with ultraviolet light prior to the introduction of the first organic gas.

* * * * *